(12) United States Patent
Arvin et al.

(10) Patent No.: US 10,950,573 B2
(45) Date of Patent: Mar. 16, 2021

(54) LEAD-FREE COLUMN INTERCONNECT

(71) Applicant: INTERNATIONAL BUSINESS MACHINES CORPORATION, Armonk, NY (US)

(72) Inventors: Charles L. Arvin, Poughkeepsie, NY (US); Clement J. Fortin, Quebec (CA); Christopher D. Muzzy, Burlington, VT (US); Krishna R. Tunga, Wappingers Falls, NY (US); Thomas Weiss, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 38 days.

(21) Appl. No.: 16/358,658

(22) Filed: Mar. 19, 2019

(65) Prior Publication Data

US 2020/0303339 A1    Sep. 24, 2020

(51) Int. Cl.
*H01L 23/00* (2006.01)
*H01L 23/532* (2006.01)

(52) U.S. Cl.
CPC ........ *H01L 24/81* (2013.01); *H01L 23/53228* (2013.01); *H01L 24/09* (2013.01); *H01L 24/16* (2013.01); *H01L 2224/0401* (2013.01); *H01L 2224/1601* (2013.01); *H01L 2224/16506* (2013.01)

(58) Field of Classification Search
CPC . H01L 2224/13111; H01L 2224/13113; H01L 2224/1607; H01L 2224/81035–81041; H01L 2224/11912; H01L 2224/81815
See application file for complete search history.

(56) References Cited

U.S. PATENT DOCUMENTS

| | | | |
|---|---|---|---|
| 5,821,161 A | 10/1998 | Covell, II et al. | |
| 6,011,693 A | 1/2000 | Gore | |
| 6,276,596 B1 | 8/2001 | Gruber et al. | |
| 8,114,771 B2 | 2/2012 | Jeon et al. | |
| 8,122,598 B2 | 2/2012 | Yokomaku | |
| 9,343,423 B2 | 5/2016 | Ferger et al. | |
| 10,390,440 B1* | 8/2019 | Lo | B23K 20/02 |
| 10,586,782 B2* | 3/2020 | Arvin | H01L 24/81 |
| 2008/0251866 A1 | 10/2008 | Belt et al. | |
| 2009/0302468 A1* | 12/2009 | Baek | H01L 24/11 257/738 |
| 2020/0091128 A1* | 3/2020 | Elsherbini | H01L 23/5329 |

FOREIGN PATENT DOCUMENTS

JP        S59165446 A        9/1984

* cited by examiner

*Primary Examiner* — Daniel Luke
(74) *Attorney, Agent, or Firm* — Law Offices of Ira D. Blecker, P.C.

(57) ABSTRACT

Disclosed are interconnects in which one substrate having a high melting temperature, lead-free solder column is joined to a second substrate having openings filled with a low melting temperature, lead-free solder such that the high melting temperature, lead-free solder column penetrates into the low melting temperature, lead-free solder so as to obtain a short moment arm of solder.

9 Claims, 9 Drawing Sheets

LEAD-FREE COLUMN INTERCONNECT

BACKGROUND

The present exemplary embodiments pertain to joining a chip to a substrate or a substrate to another substrate using a lead-free column.

Improvements in performance of a semiconductor chip package and the semiconductor chip may lead to additional sensitivity to thermal and mechanical stresses.

BRIEF SUMMARY

The various advantages and purposes of the exemplary embodiments as described above and hereafter are achieved by providing, according to an aspect of the exemplary embodiments, a method of interconnecting using a lead-free column, the method comprising depositing metallization for an underbump metallurgy (UBM) on a semiconductor device; forming a copper pillar on the UBM, the copper pillar having an end; plating a high melting temperature, lead-free solder on a portion of the end such that an area of the portion is less than an area of the end so as to leave an exposed portion of the end that is not covered by the high melting temperature, lead-free solder; etching the copper pillar that is not covered by the high melting temperature, lead-free solder; contacting the high melting temperature, lead-free solder to a low melting temperature, lead-free solder on a laminate substrate; and reflowing the low melting temperature, lead-free solder so that the high melting, lead-free solder and copper pillar penetrate into the reflowed low melting, lead-free solder a predetermined distance.

According to another aspect of the exemplary embodiments, there is proposed a method of interconnecting using a lead-free column, the method comprising: pre-soldering a first laminate with a low melting temperature, lead-free solder; placing high melting temperature, lead-free columns into contact with the low melting temperature, lead-free solder on the laminate; reflowing the low melting temperature lead-free solder of the first laminate so as to join the low melting temperature lead-free solder with the high melting temperature, lead-free columns; pre-soldering a second laminate having openings with a solder in the openings; positioning the first laminate with respect to the second laminate such that the high melting temperature, lead-free columns of the first laminate are in contact with the solder of the second laminate; and reflowing the solder of the second laminate so as to join with the high melting temperature, lead-free columns.

According to a further aspect of the exemplary embodiments, there is proposed an interconnect having a lead-free column comprising: a semiconductor device having underbump metallurgy (UBM), a copper pillar on the UBM, a high melting temperature, lead-free solder on the copper pillar such that a thickness, as measured from a surface of the semiconductor device, of the copper pillar is less than the thickness of the high melting temperature, lead-free solder; and a laminate substrate having openings containing a low melting temperature, lead-free solder; the semiconductor device being joined to the laminate substrate by the high melting, lead-free solder and copper pillar penetrated into the low melting, lead-free solder a predetermined distance.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1 to 8 illustrate one exemplary embodiment in which:

FIG. 1 illustrates a semiconductor chip having terminal metallurgy and photoresist having an opening;

FIG. 2 illustrates the semiconductor chip of FIG. 1 having a copper pillar in the opening in the photoresist;

FIG. 3 illustrates the semiconductor chip of FIG. 2 having a second photoresist and a second, smaller opening in the second photoresist;

FIG. 4 illustrates the semiconductor chip of FIG. 3 having a lead-free, high temperature solder in the second, smaller opening in the second photoresist;

FIG. 5 illustrates the semiconductor chip of FIG. 4 in which the photoresist and second photoresist have been stripped;

FIG. 6 illustrates the semiconductor chip of FIG. 5 in which the terminal metallurgy and copper pillar have been etched;

FIG. 7 illustrates the semiconductor chip of FIG. 6 which has been inverted for joining with a laminate substrate; and FIG. 8 illustrates the semiconductor chip of FIG. 7 which has been joined to the laminate substrate.

FIGS. 9 to 16 illustrate another exemplary embodiment in which:

FIG. 9 illustrates a semiconductor chip having terminal metallurgy and photoresist having an opening;

FIG. 10 illustrates the semiconductor chip of FIG. 9 having a copper pillar, a layer of nickel and a layer of copper in the opening in the photoresist;

FIG. 11 illustrates the semiconductor chip of FIG. 10 having a second photoresist and a second, smaller opening in the second photoresist;

FIG. 12 illustrates the semiconductor chip of FIG. 11 having a lead-free, high temperature solder in the second, smaller opening in the second photoresist;

FIG. 13 illustrates the semiconductor chip of FIG. 12 in which the photoresist and second photoresist have been stripped;

FIG. 14 illustrates the semiconductor chip of FIG. 13 in which the terminal metallurgy, copper pillar and plated layer of copper have been etched;

FIG. 15 illustrates the semiconductor chip of FIG. 14 which has been inverted for joining with a laminate substrate; and FIG. 16 illustrates the semiconductor chip of FIG. 15 which has been joined to the laminate substrate.

FIGS. 17 to 19 illustrate a further exemplary embodiment in which:

FIG. 17 illustrates a semiconductor chip similar to FIG. 14 except that the high melting temperature, lead-free solder has been reflowed at a temperature sufficient to cause melting of the high melting temperature, lead-free solder;

FIG. 18 illustrates the semiconductor chip of FIG. 17 which has been inverted for joining with a laminate substrate; and FIG. 19 illustrates the semiconductor chip of FIG. 18 which has been joined to the laminate substrate.

FIGS. 20 to 25 illustrate yet another exemplary embodiment in which:

FIG. 20 illustrates a laminate for bonding to a semiconductor chip and having bonding pads for receiving a solder interconnect;

FIG. 21 illustrates the laminate of FIG. 20 in which the bonding pads are pre-soldered with low melting temperature, lead-free solder;

FIG. 22 illustrates the laminate of FIG. 21 in which high melting temperature, lead-free solder columns are placed on the low melting temperature, lead-free solder;

FIG. 23 illustrates the laminate of FIG. 22 after reflow of the low melting temperature, lead-free solder;

FIG. 24 illustrates the laminate of FIG. 23 which has been inverted for joining with a laminate substrate; and FIG. 25 illustrates the laminate of FIG. 24 which has been joined to the laminate substrate.

DETAILED DESCRIPTION

The exemplary embodiments provide a lead-free column that is inserted into a low melting temperature, lead-free solder that is maintained through a subsequent chip join. A particular advantage of the exemplary embodiments is the lead-free column interconnect, being inserted into the opposing substrate, has a short moment arm to reduce the stress on the lead-free column interconnect.

Referring now to FIGS. 1 to 8, there is described an exemplary method of manufacturing a lead-free column interconnect.

Figure 1:
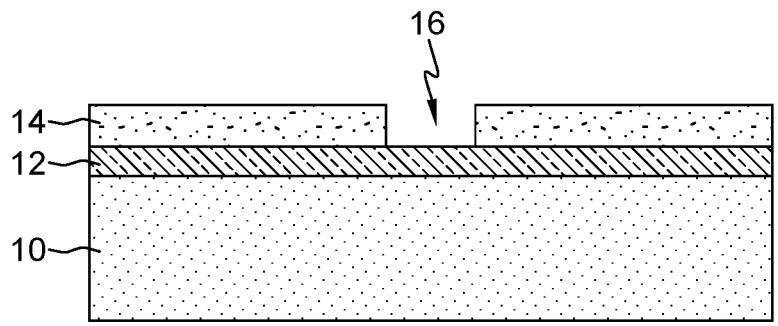

In FIG. 1, there is illustrated a semiconductor chip 10 having a terminal metallurgy 12 which may be formed, for example, by sputtering. Only part of the semiconductor chip 10 is shown. The terminal metallurgy 12 may be, for example, a titanium/tungsten alloy (1600 angstroms thick) and copper (4500 angstroms thick) (TiW/Cu) or titanium (1600 angstroms) and copper (4500 angstroms). For finer pitches (for example, about 50 microns) the titanium/tungsten alloy may decrease to about 1000 angstroms and the copper may decrease to about 2200 angstroms thick. Photoresist 14 has been conventionally applied and developed to form an opening 16 for receiving a copper pillar. While the description hereafter only describes the process for forming one copper pillar, it should be understood that there is usually a plurality of such copper pillars for forming a plurality of interconnects.

Figure 2:
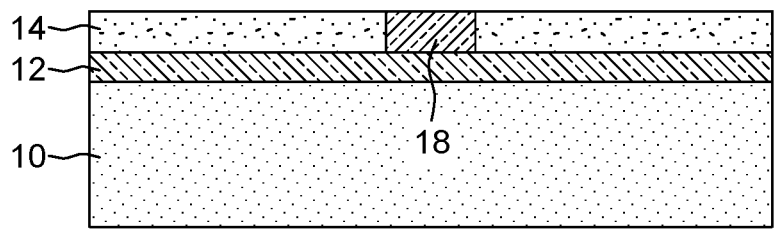

In FIG. 2, the copper pillar 18 is formed, for example, by plating within the opening 16 within the photoresist 14. For the purpose of illustration and not limitation, the copper pillar 18 may have a height of 5 to 10 microns.

Figure 3:
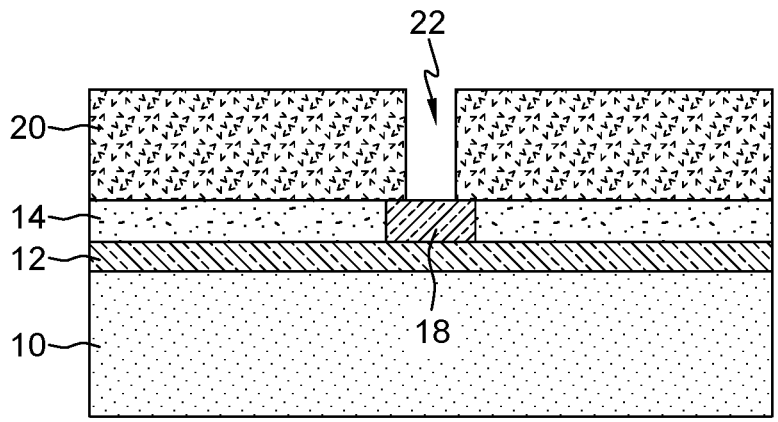

In FIG. 3, additional photoresist 20 has been applied and developed to form an opening 22 for a receiving a high melting temperature, lead-free solder. It is preferred that a photoresist be used that may achieve an aspect ratio of about 4:1 at lithography so that a thin, tall solder column results. The opening 22 is aligned to be approximately over a central portion of the copper pillar 18. It is noted that the area of the opening 22 is less than the area of the end of the copper pillar 18. For large pitch features such as 150 um pitch where the area of the end of the copper pillar 18 would be about 92 microns, the central portion in opening 22 of the pillar 18 would be less than 82 microns and larger than 20 microns. For small pitch features such as 50 um pitch where the area of the end of the copper pillar 18 would be about 30 microns, the central portion in opening 22 of the pillar 18 would be less than 20 microns and larger than 10 microns.

Figure 4:
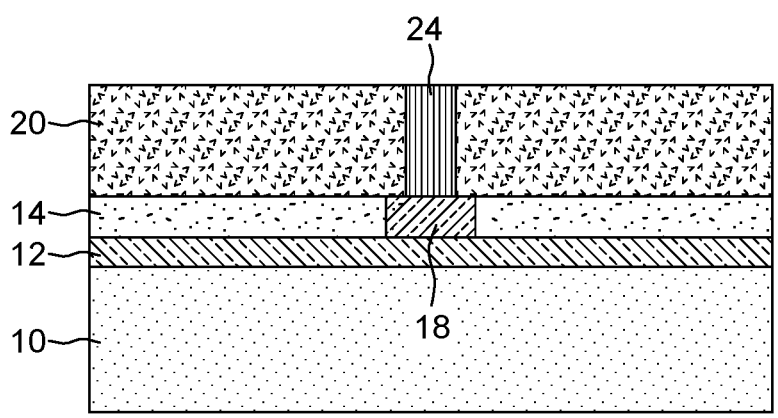

In FIG. 4, the high melting temperature, lead-free solder 24 may be applied, for example by plating, into the opening 22 so as to make direct contact with the copper pillar 18. The high melting temperature, lead-free solder 24 may be for example a tin/bismuth alloy having at least 85 weight t % bismuth, remainder tin. For the purpose of illustration and not limitation, the high melting temperature, lead-free solder 24 may have a thickness of 30 to 40 microns.

Figure 5:
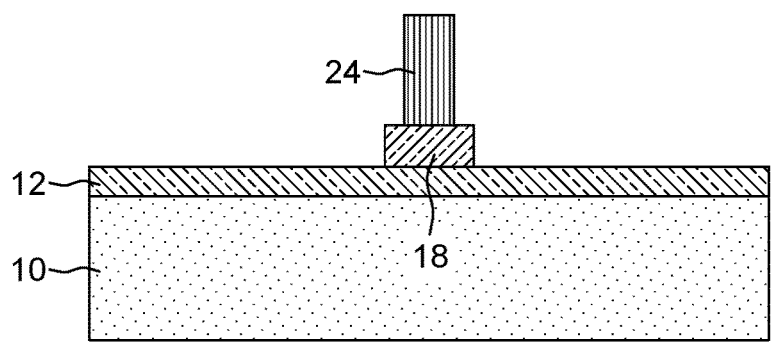
Figure 6:
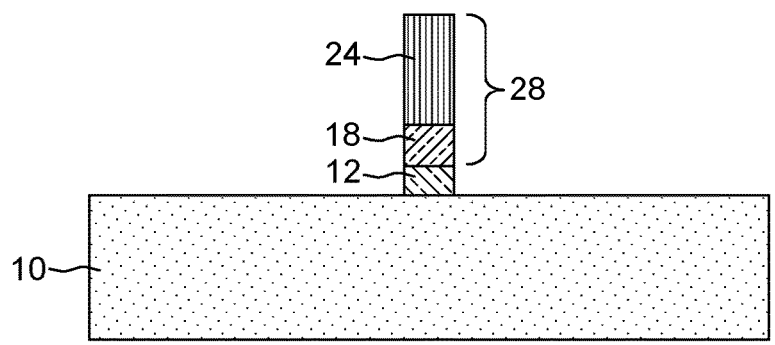

In FIG. 5, the photoresists 14 and 20 may be conventionally stripped and then the terminal metallurgy 12 having the copper seed layer and copper pillar 18 with the high melting temperature, lead-free solder 24 may be exposed to an etchant. Various copper etchants may be used that include ammonium persulfate, glycine and alanine based. The choice is dependent upon the pitch of the copper pillars 18, concentration of the etchant and tool set utilized. The etchant etches only the copper seed layer on the terminal metallurgy 12 and the exposed portion of the copper pillar 18 not covered by the high melting temperature, lead-free solder 24 so as to recess the copper pillar 18. The copper etchants are isotropic in nature and are designed to remove between 100 nanometers to 500 nanometers of copper seed layer on the terminal metallurgy 12. However, since the sputtered copper seed layer typically has the grain orientation normal to the wafer surface that etches the fastest, it is observed that the plated copper etches at a rate that is only about 60 to 80% that of the sputtered copper seed layer. This means that the amount of copper removed from the copper pillar 18 is around 60 nanometers to 300 nanometers. The high melting temperature, lead-free solder 24 is unaffected by the etchant 26. The resulting structure is shown in FIG. 6. The copper pillar 18 and the high melting temperature, lead-free solder 24 may collectively be referred to as the column interconnect 28.

Figure 7:
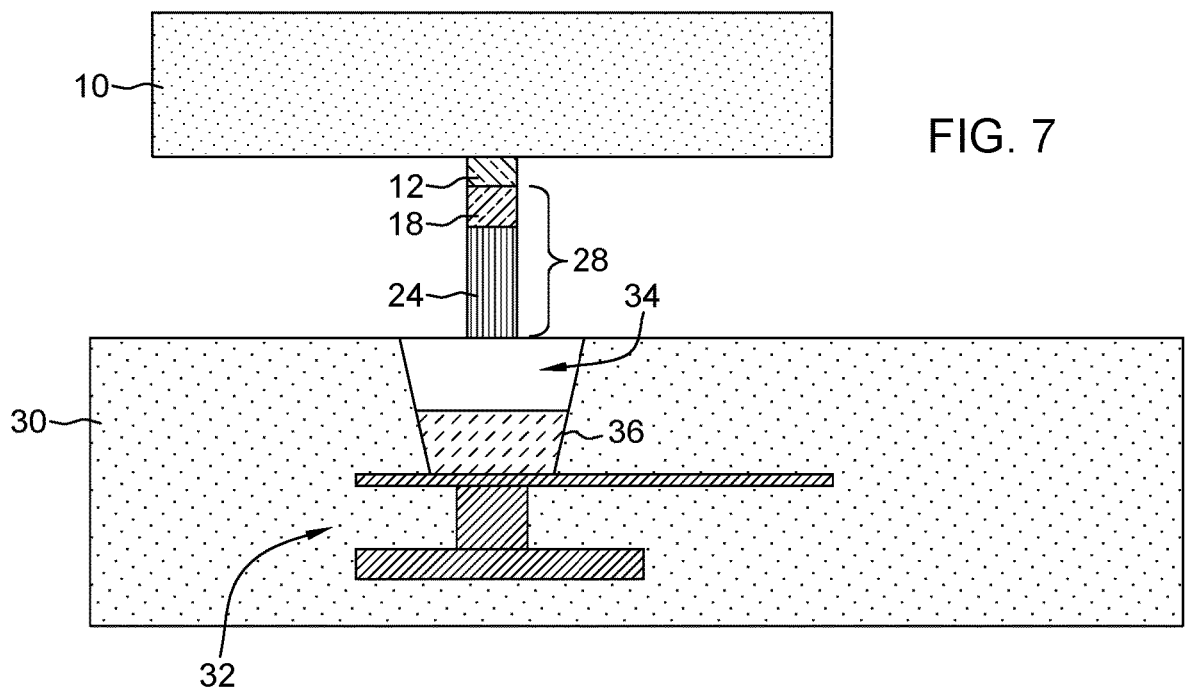

Referring now to FIG. 7, there is shown a laminate substrate 30 having internal wiring 32 and an opening 34 for receiving the column interconnect 28. Included within opening 34 may be a low melting temperature, lead-free solder 36. The semiconductor chip 10 is inverted so that the column interconnect 28 is aligned with the opening 34.

Figure 8:
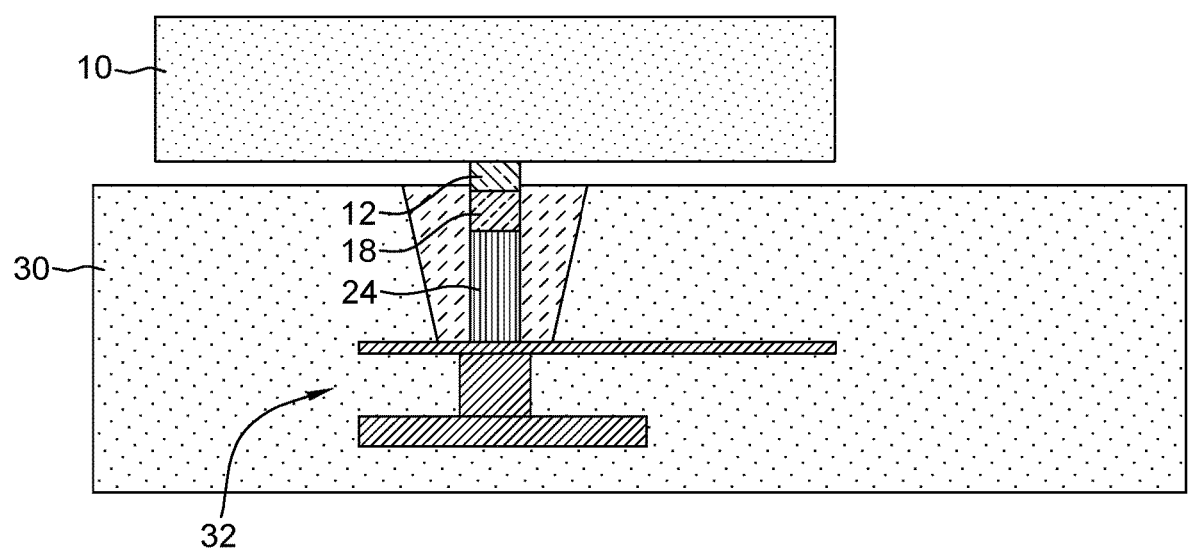

In FIG. 8, the semiconductor chip 10 and laminate substrate 30 may be moved closer together and heated to a temperature above the liquidus of the low melting temperature, lead-free solder 36 so that the column interconnect 28 may enter into the low melting temperature, lead-free solder 36 and make contact with the internal wiring 32 of the laminate substrate 30. The heating temperature is not so high to cause melting of the high melting temperature, lead-free solder 24. For example, where the high melting temperature, lead-free solder 24 is tin plus 85 weight % bismuth and the low melting temperature, lead-free solder 36 is tin plus 57 weight % bismuth, a suitable heating temperature may be about 140° C. Upon cooling to a temperature below the solidus of the low melting temperature, lead-free solder 36, the column interconnect 29 becomes embedded in the low melting temperature, lead-free solder 36.

Reference has been made herein to the high melting temperature, lead-free solder 24 and the low melting temperature, lead-free solder 36. The high melting temperature, lead-free solder 24 should have a peak temperature that is more than 50° C. above the peak temperature of the low melting temperature, lead-free solder 36. The peak temperature is the temperature where more than 50% and preferably 90% of the mass of the solder has become liquid. Some suitable alloys for the low melting temperature, lead-free solder 36 may include tin plus 1-2 weight % gold, tin plus 50 to 65 weight % bismuth, tin plus 40 weight % bismuth plus 0.5 weight % Cu and 0.03 weight % Ni and tin plus 0.5-1 weight % gold, 0.5-1 weight % copper and 1-6 weight % silver.

For some of the alloys used for the high melting temperature, lead-free solder 24, such as tin/gold, the maximum peak temperature is up to 280° C. If thermal compression bonding is used as part of the assembly process, the peak temperature may be reduced by 10 to 20° C.

Referring now to FIGS. 9 to 16, there is described another exemplary method of manufacturing a lead-free column interconnect.

Figure 9:
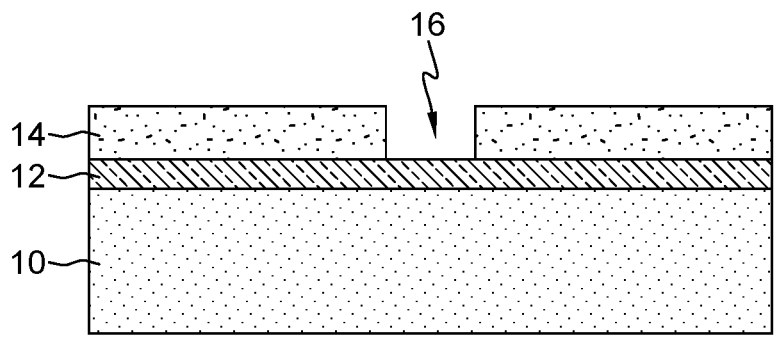

FIG. 9 is substantially identical to FIG. 1 illustrating the semiconductor chip 10 having the terminal metallurgy 12 and photoresist 14 applied and developed to form an opening 16 for receiving the copper pillar.

Figure 10:
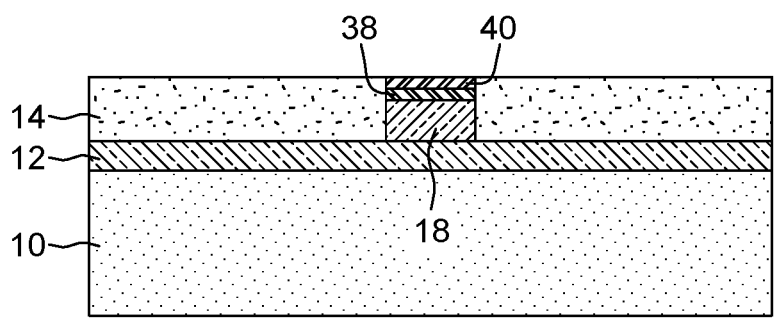

In FIG. 10, the copper pillar 18 is formed as before to a height of, for example, 5 to 10 microns, within the opening 16 within the photoresist 14. In this exemplary embodiment, a nickel layer 38 may be formed, for example by plating, on the copper pillar 18 followed by a copper layer 40 formed, for example by plating, on the nickel layer 38. For the purpose of illustration and not limitation, the nickel layer 38 may have a thickness of about 2 microns and the copper layer 40 may have a thickness of about 1 micron.

Figure 11:
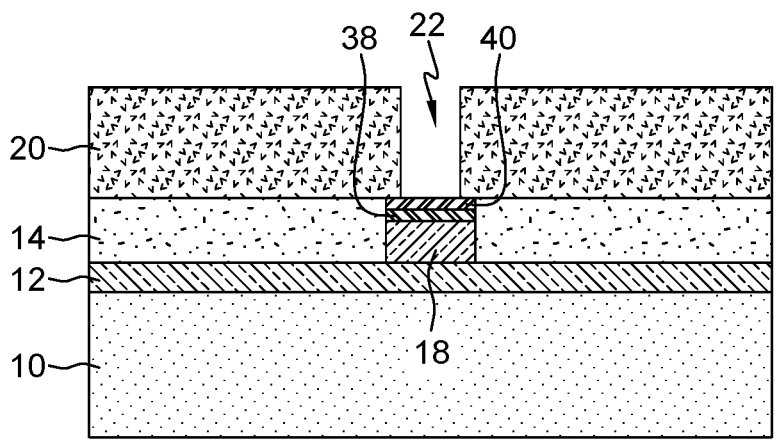

In FIG. 11 additional photoresist 20 has been applied and developed to form an opening 22 for receiving a high melting temperature, lead-free solder. The opening 22 is aligned to be approximately over a central portion of the copper layer 40. It is noted that the area of the opening 22 is less than the area of the end of the copper layer 40.

Figure 12:
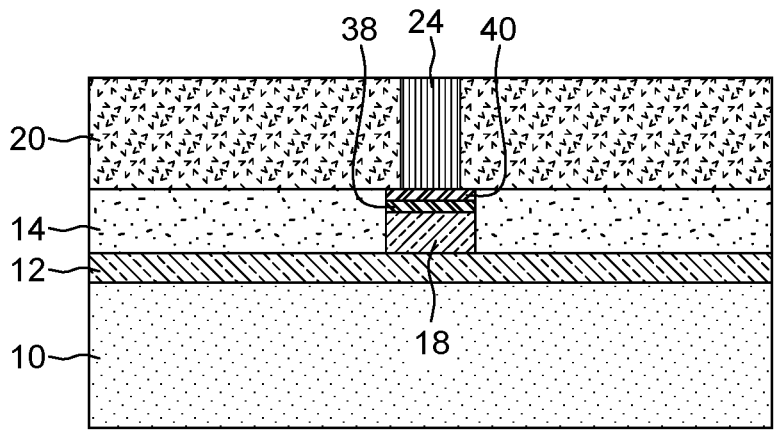

In FIG. 12, the high melting temperature, lead-free solder 24 may be applied, for example by plating, into the opening 22 so as to make direct contact with the copper layer 40. The high melting temperature, lead-free solder 24 may be for example a tin/bismuth alloy having at least 85 weight % bismuth, remainder tin. For the purpose of illustration and not limitation, the high melting temperature, lead-free solder 24 may have a thickness of about 30 to 40 microns.

Figure 13:
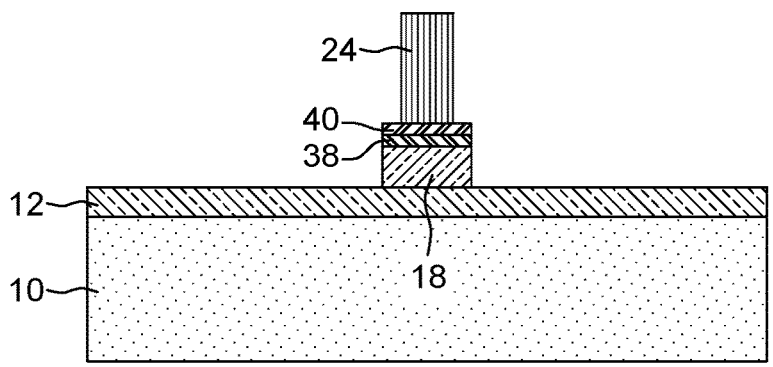
Figure 14:
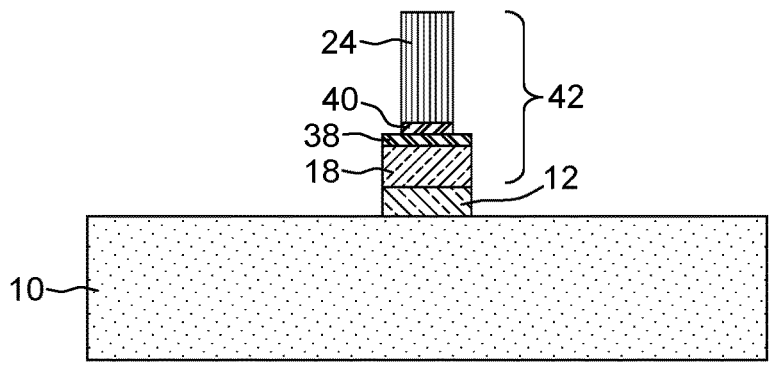

In FIG. 13, the photoresists 14 and 20 may be conventionally stripped and then the terminal metallurgy 12 having the copper seed layer and the copper layer 40 with the high melting temperature, lead-free solder 24 are exposed to an etchant. Various copper etchants may be used that include ammonium persulfate, glycine and alanine based. The choice is dependent upon the pitch of the pillars, concentration of the etchant and tool set utilized. The etchant etches only the copper seed layer of the terminal metallurgy 12 and copper layer 40 to expose the nickel layer 38. The copper layer 40 not exposed to the etchant 26 is directly under the high melting temperature, lead-free solder 24. The high melting temperature, lead-free solder 24 is unaffected by the etchant 26. The resultant structure is the remaining portion of the terminal metallurgy 12, the copper pillar 18 having the nickel layer 38, the remaining portion of the copper layer 40 and the high melting temperature, lead-free solder 24 as shown in FIG. 14. The copper pillar 18, nickel layer 38, copper layer 40 and the high melting temperature, lead-free solder 24 may collectively be referred to as the column interconnect 42.

Figure 15:
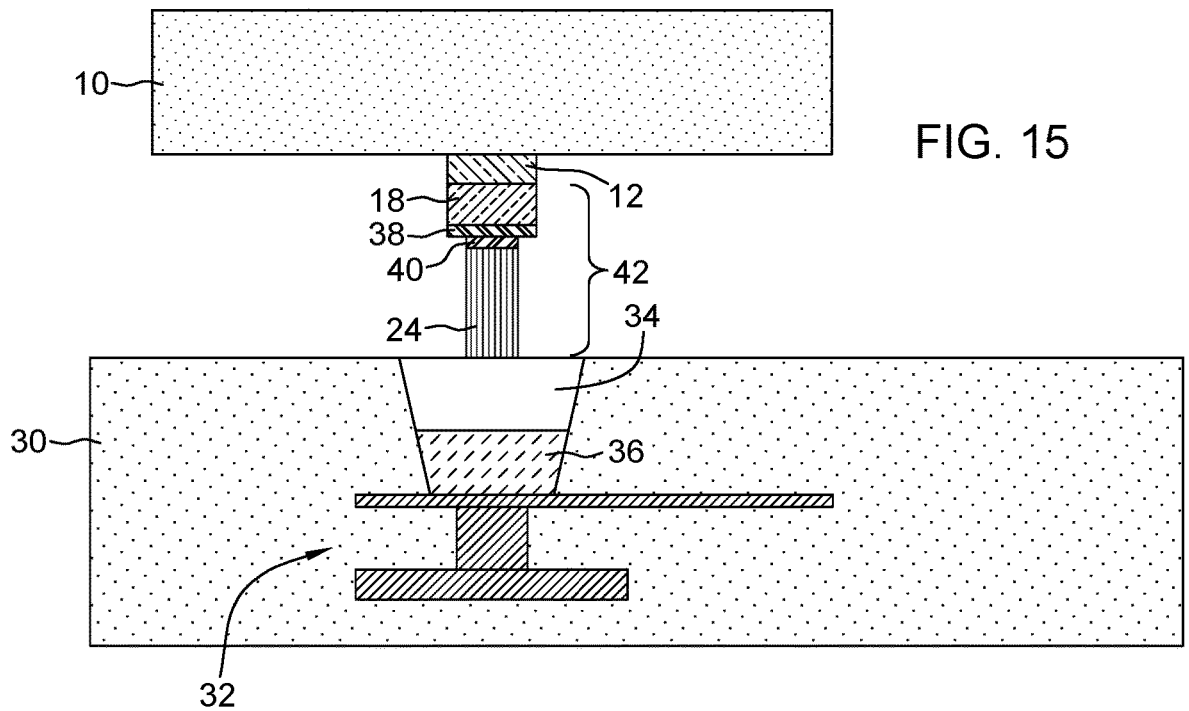

Referring now to FIG. 15, there is shown the laminate substrate 30 having internal wiring 32 and an opening 34 for receiving the column interconnect 42. Included within opening 34 may be a low melting temperature, lead-free solder 36. The semiconductor chip 10 is inverted so that the column interconnect 42 is aligned with the opening 34.

Figure 16:
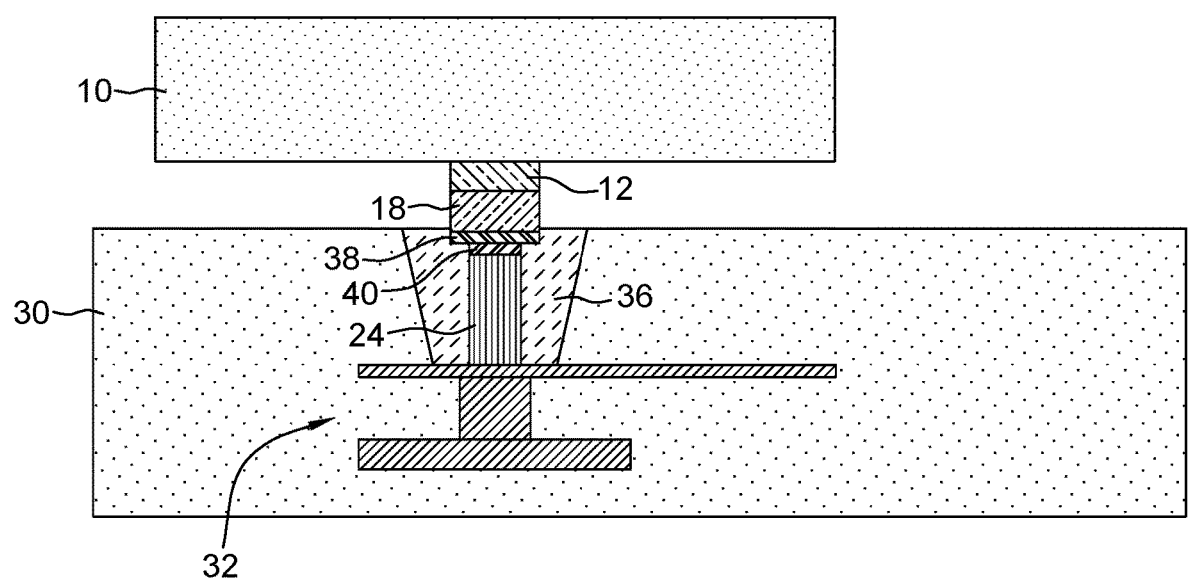

In FIG. 16, as discussed previously with respect to FIG. 8, the semiconductor chip 10 and laminate substrate 30 may be moved closer together and heated to a temperature above the liquidus of the low melting temperature, lead-free solder 36, for example about 140° C. so that the column interconnect 42 may enter into the low melting temperature, lead-free solder 36 and make contact with the internal wiring 32 of the laminate substrate 30. Upon cooling to a temperature below the solidus of the low melting temperature, lead-free solder 36, the column interconnect 42 becomes embedded in the low melting temperature, lead-free solder 36.

Again, the high melting temperature, lead-free solder 24 should have a peak temperature (as previously defined) that is more than 50° C. above the peak temperature of the low melting temperature, lead-free solder 36.

Figure 17:
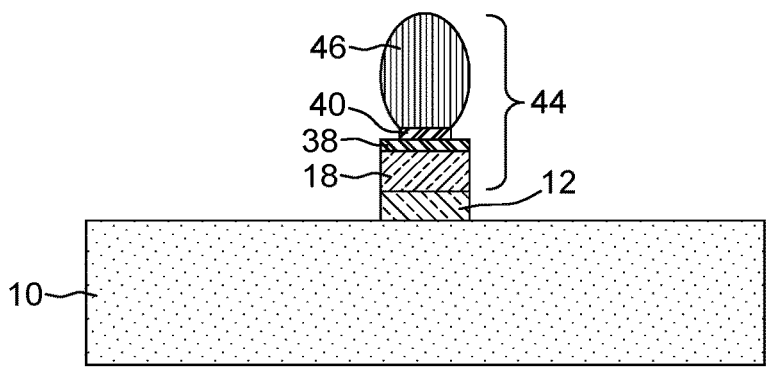
Figure 18:
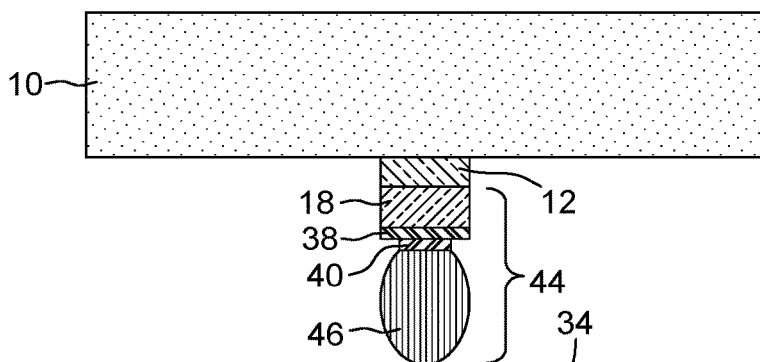
Figure 19:
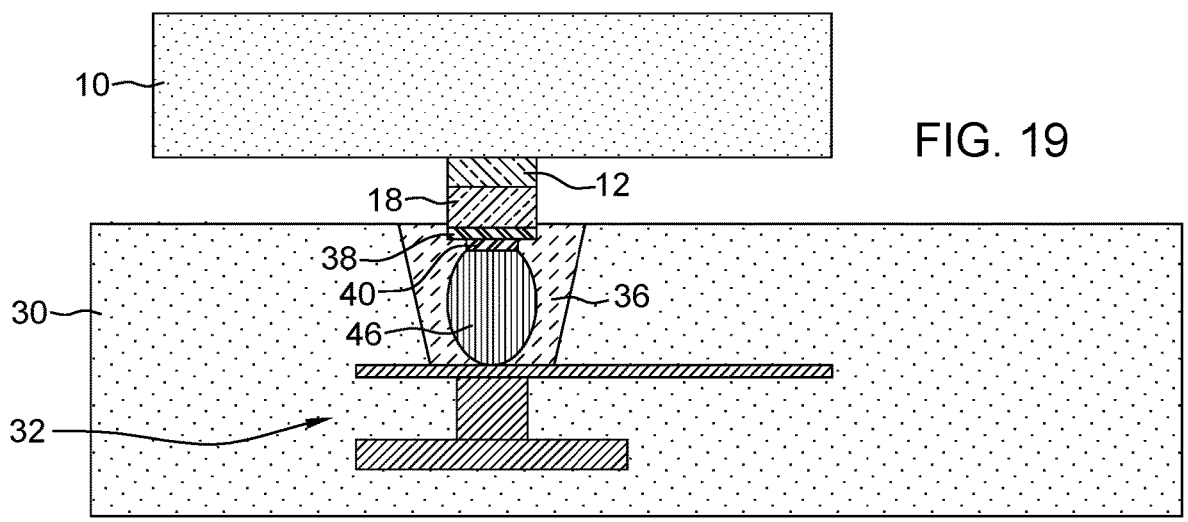

Referring now to FIGS. 17 to 19, there is described another exemplary method of manufacturing a lead-free column interconnect.

The lead-free column interconnect is processed in a similar manner to the previous exemplary embodiment up to FIG. 14 except that the high melting temperature, lead-free solder may be plated or screened to a thickness of about 25 microns. Referring now to FIG. 17, the high melting temperature, lead-free solder 46 has been reflowed at a temperature sufficient to cause melting of the high melting temperature, lead-free solder 46. For a high melting temperature, lead-free solder 46 having the composition of tin plus 85 weight % bismuth, this reflow temperature would be 250° C. and held at this temperature for 2 minutes to cause reflow of the high melting temperature, lead-free solder 46.

In FIG. 17, the column interconnect 44 includes the copper pillar 18, nickel layer 38, copper layer 40 and high melting temperature, lead-free solder 46.

Referring now to FIG. 18, there is shown the laminate substrate 30 having internal wiring 32 and an opening 34 for receiving the column interconnect 44. Included within opening 34 may be a low melting temperature, lead-free solder 36. The semiconductor chip 10 is inverted so that the column interconnect 44 is aligned with the opening 34.

In FIG. 19, as discussed previously with respect to FIGS. 8 and 16, the semiconductor chip 10 and laminate substrate 30 may be moved closer together and heated to a temperature above the liquidus of the low melting temperature, lead-free solder 36, for example about 140° C., so that the column interconnect 44 may enter into the low melting temperature, lead-free solder 36 and make contact with the internal wiring 32 of the laminate substrate 30. Upon cooling to a temperature below the solidus of the low melting temperature, lead-free solder 36, the column interconnect 44 becomes embedded in the low melting temperature, lead-free solder 36.

Again, the high melting temperature, lead-free solder 24 should have a peak temperature (as previously defined) that is more than 50° C. above the peak temperature of the low melting temperature, lead-free solder 36.

Referring now to FIGS. 20 to 25, there is described another exemplary method of manufacturing a lead-free column interconnect. In this exemplary embodiment, the lead-free column interconnect may be formed on a laminate, such as an interposer, which may then be joined to a daughter card or board which, in turn, may have for example ball grid array (BGA) connections.

Figure 20:
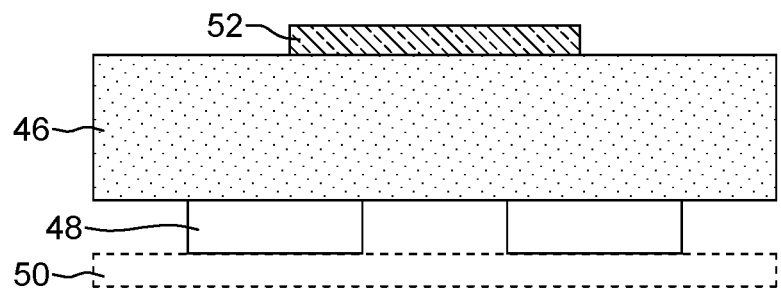

Referring to FIG. 20, there is shown a laminate 46, for example an organic interposer, on which are formed bonding pads 48 for bonding to a semiconductor chip 50. Only two bonding pads 48 are shown but it should be understood that in practice there will be many more such bonding pads 48 for bonding to the semiconductor chip 50. In one process sequence, the semiconductor chip 50 may be present during the process flow in FIGS. 20 to 25 and in another process sequence, the semiconductor chip 50 may be joined after the process flow in FIGS. 20 to 25. The presence or absence of the semiconductor chip 50 is not important to the exemplary embodiment illustrated in FIGS. 20 to 25.

The laminate 46 may also have bonding pads 52 for joining lead-free column interconnects to the laminate 46. Again, while only one bonding pad 52 is shown, in practice there will usually be a plurality of such bonding pads 52. The bonding pads 52 may be made of an alloy such as titanium tungsten.

Figure 21:
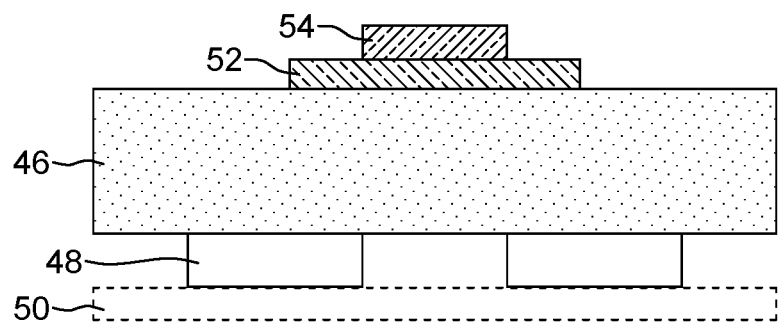

In FIG. 21, the bonding pads 52 may be pre-soldered with a low melting temperature, lead-free solder 54 which may be, for example, a tin/bismuth eutectic alloy (57 weight % bismuth, remainder tin).

Figure 22:
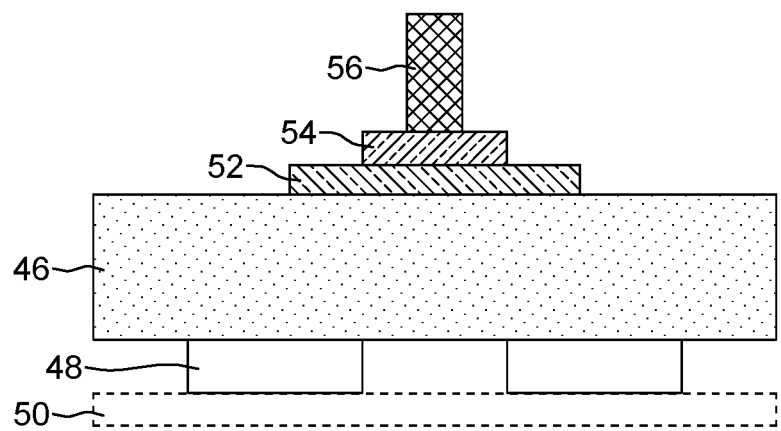
Figure 23:
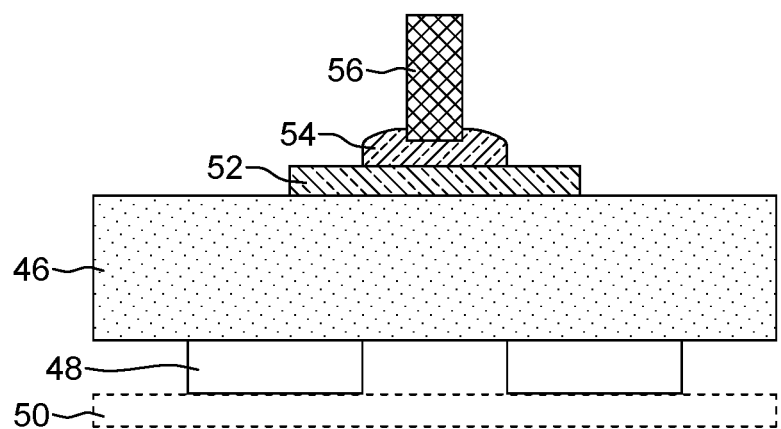

In FIG. 22, high melting temperature, lead-free solder columns 56 may be placed on the low melting temperature, lead-free solder 54 and then the assembly of laminate 46, bonding pads 48, 52, low melting temperature, lead-free solder 54 and high melting temperature, lead-free solder columns 56 may be heated to about 140° C. for 1 minute to reflow the low melting temperature, lead-free solder 54 to join the high melting temperature, lead-free solder columns 56 to the laminate 46 resulting in the structure shown in FIG. 23. The high melting temperature, lead-free solder columns 56 may also be referred to as the column interconnect 56 in this exemplary embodiment.

In practice, the low melting temperature, lead-free solder 54 gets mixed with the high melting temperature, lead-free solder columns 56 after the reflow, If the low melting temperature, lead-free solder 54 is no more that about 10 weight % of the high melting temperature, lead-free solder columns 56, the low melting temperature, lead-free solder 54 is converted to a new melting temperature about 10 to 20° C. below that of the high melting temperature, lead-free solder columns 56.

In one exemplary embodiment, the high melting temperature, lead-free solder columns 56 may be all solder and have a composition of, for example, tin plus 90 weight % or more of bismuth.

In another exemplary embodiment, the high melting temperature, lead-free solder columns 56 may have a polymer core such as polyimide with an outside coating of high melting temperature, lead-free solder such as tin plus 90 weight % or more of bismuth. An advantage of this exemplary embodiment is that the polymer core may be able to flex to absorb the stress from either side of the package.

In a further exemplary embodiment, high melting temperature, lead-free solder columns 56 may have a core such as copper, nickel, nickel/iron alloy from 10 weight percent to 90 weight percent Fe or carbon nanotube with an outside coating of high melting temperature, lead-free solder such as tin plus 90 weight % or more of bismuth. The metallic core may limit the amount of bismuth that will enter into the low melting temperature, lead-free solder 54 that would lead to an increase in its melting temperature with time.

Figure 24:
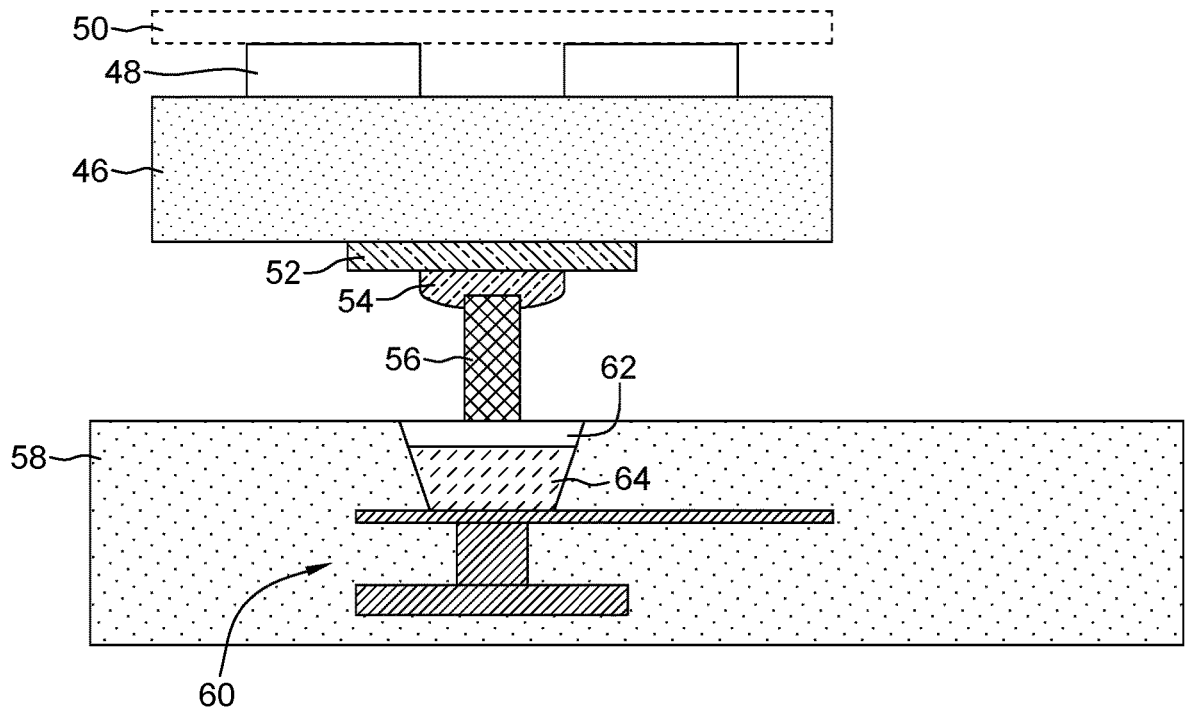

Referring now to FIG. 24, there is shown the next level of packaging, a laminate substrate 58 which may be a daughter card or mother board. The laminate substrate 58 has internal wiring 60 and an opening 62 for receiving the column interconnect 56. Included within opening 62 may be a low melting temperature, lead-free solder 64. The laminate 46 is inverted so that the column interconnect 56 is aligned with the opening 62.

Figure 25:
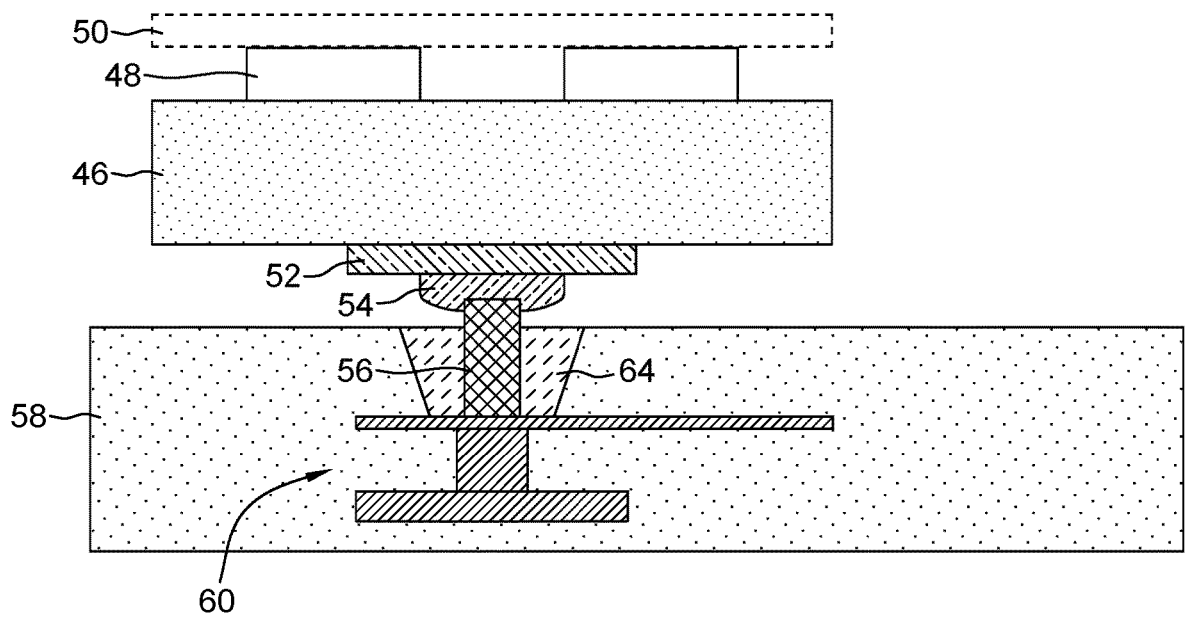

In FIG. 25, the laminate 46 and laminate substrate 58 may be moved closer together and heated to a temperature above the liquidus of the low melting temperature, lead-free solder 64, for example about 140° C., so that the column interconnect 56 may enter into the low melting temperature, lead-free solder 64 and make contact with the internal wiring 60 of the laminate substrate 58. However, due to the conversion of the low melting temperature lead-free solder 54 to a higher melting temperature, the reflow to join the column interconnect 56 to the laminate substrate 58 may take place at a higher temperature such as up to 220° C. Upon cooling to a temperature below the solidus of the low melting temperature, lead-free solder 64, the column interconnect 56 becomes embedded in the low melting temperature, lead-free solder 64.

The high melting temperature, lead-free solder columns 56 should have a peak temperature (as previously defined) that is more than 50° C. above the peak temperature of the low melting temperature, lead-free solder 54 that joins the solder columns to the laminate as well as the peak temperature of the low melting temperature, lead free solder 64 on the laminate substrate 58.

In the Figures, the solder column 24, 46, 56 is shown in contact with a pad in internal wiring 32, 60. While it is preferred that the solder column 24, 46, 56 is in contact with the pad in internal wiring 32, 60, the solder column 24, 46, 56 does not have to touch the pad in the internal wiring 32, 60. The exemplary embodiments gain all of the stress relief and most of the electrical performance even if there is a small gap between the solder column 24, 46, 56 and the pad in internal wiring 32, 60. The gap may be up to 10 microns and preferably is no more than 5 microns.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of interconnecting using a lead-free column, the method comprising:
    depositing metallization for an underbump metallurgy (UBM) on a semiconductor device;
    forming a copper pillar on the UBM, the copper pillar having an end;
    plating a high melting temperature, lead-free solder on a portion of the end such that an area of the portion is less than an area of the end so as to leave an exposed portion of the end that is not covered by the high melting temperature, lead-free solder;
    etching the copper pillar that is not covered by the high melting temperature, lead-free solder;
    contacting the high melting temperature, lead-free solder to a low melting temperature, lead-free solder on a laminate substrate; and
    reflowing the low melting temperature, lead-free solder so that the high melting, lead-free solder and copper pillar penetrate into the reflowed low melting, lead-free solder a predetermined distance.

2. The method of claim 1 wherein the high melting temperature, lead-free solder has a peak temperature that is more than 50° C. above the peak temperature of the low melting temperature, lead-free solder such that the peak temperature of the high melting temperature, lead-free solder is a temperature where more than 50% of a mass of the high melting temperature, lead-free solder has become liquid and the peak temperature of the low melting temperature, lead-free solder is a temperature where more than 50% of a mass of the low melting temperature, lead-free solder has become liquid.

3. The method of claim 1 wherein the high melting temperature, lead-free solder has a peak temperature that is more than 50° C. above the peak temperature of the low melting temperature, lead-free solder such that the peak temperature of the high melting temperature, lead-free solder is a temperature where more than 90% of a mass of the high melting temperature, lead-free solder has become liquid and the peak temperature of the low melting temperature, lead-free solder is a temperature where more than 90% of a mass of the low melting temperature, lead-free solder has become liquid.

4. The method of claim 1 wherein after forming the copper pillar and before plating the high melting temperature, lead-free solder further comprising forming a nickel layer followed by forming a copper layer on the end.

5. The method of claim 1 wherein plating the high melting temperature, lead-free solder is to a thickness of 30 to 40 microns.

6. The method of claim 1 wherein the copper pillar having a thickness of 5 to 10 microns.

7. The method of claim 1 wherein the high melting temperature, lead-free solder is an alloy of tin and bismuth having a composition of 85 weight percent bismuth, remainder tin.

8. The method of claim 1 wherein plating the high melting temperature, lead-free solder is to a thickness of 25 microns and after etching the copper pillar and before contacting, further comprising reflowing the high melting temperature, lead-free solder.

9. The method of claim 1 wherein after forming the copper pillar and before plating the high melting temperature, lead-free solder further comprising masking the end so that only the portion of the end is visible; and after plating the high melting temperature, lead-free solder on the portion of the end, further comprising stripping the masking so as to reveal the exposed portion of the end that is not covered by the high melting, lead-free solder.

* * * * *